(12) United States Patent
Mirov

(10) Patent No.: US 6,573,704 B2
(45) Date of Patent: Jun. 3, 2003

(54) METHOD AND APPARATUS FOR ISOLATING AN AMBIENT AIR TEMPERATURE SENSOR

(75) Inventor: Russell N. Mirov, Los Altos, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 225 days.

(21) Appl. No.: 09/745,829

(22) Filed: Dec. 21, 2000

(65) Prior Publication Data

US 2002/0080852 A1 Jun. 27, 2002

(51) Int. Cl.[7] .......................... G01R 31/26; G01R 31/28
(52) U.S. Cl. .................... 324/158.1; 374/152; 374/141; 174/252
(58) Field of Search ................................. 374/152, 141, 374/33; 324/760, 158.1, 754, 765, 763; 361/740, 777; 713/300, 322; 257/467; 174/252

(56) References Cited

U.S. PATENT DOCUMENTS 6,092,926 A * 7/2000 Still et al. .................... 374/141
6,321,175 B1 * 11/2001 Nagaraj ....................... 374/152
6,445,204 B1 * 9/2002 He et al. ...................... 324/763

* cited by examiner

Primary Examiner—Kamand Cuneo
Assistant Examiner—Jimmy Nguyen
(74) Attorney, Agent, or Firm—Meyertons Hood Kivlin Kowert & Goetzel, P.C.; B. Noël Kivlin

(57) ABSTRACT

A method and apparatus for thermally isolating a temperature sensor mounted on a printed circuit board from a heat generating component mounted on the printed circuit board is provided. Generally, a thermal isolation region, which may be comprised of a plurality of openings in the printed circuit board, is disposed about the temperature sensor to interrupt conductive transfer of heat from the heat generating component to the temperature sensor. The openings extend sufficiently far into the printed circuit board to remove at least a portion of a conductive layer, such as a power plane from the region surrounding the temperature sensor. Electrical power and signals may be provided to the temperature sensor through regions intermediate the openings.

19 Claims, 4 Drawing Sheets

METHOD AND APPARATUS FOR ISOLATING AN AMBIENT AIR TEMPERATURE SENSOR

BACKGROUND OF THE INVENTION

1. Field of the Invention

This invention relates generally to method and apparatus for detecting ambient air temperature within an electronic device, and, more paticularly, to a method and apparatus for isolating a temperature sensor from local heating effects of the electronic device.

2. Description of the Related Art

Electronic devices produce heat during operation, and thus, some form of cooling may be required to ensure that they do not overheat during operation. For example, option modules commonly employed in workstations or personal computers are typically constructed from a plurality of discrete and integrated semiconductor devices as well as passive devices, such as resistors, capacitors, and inductors, disposed on a printed circuit board. Each of these devices individually produces at least some heat, and can collectively produce substantial local heating. Typically, heat sinks are positioned in contact with at least some of the heat producing devices, and fans are located on or adjacent the option module to provide substantial air flow over the surface of the devices as well as through the heat sinks. This flow of air is often sufficient to maintain the temperature of the option module within acceptable limits.

To reduce acoustic noise and conserve power consumed by the workstation, it has proven useful to limit the operation of the fan to an as-needed basis. That is, the workstation will operate more quietly and power consumption may be reduced by only operating the fan when additional cooling is required. Typically, a temperature sensor may be deployed on the option module to detect ambient temperature with the workstation, which has proven to be a reliable indicator of the operating temperature of the workstation. That is, operation of the cooling fan may be controlled based on an accurate measurement of the ambient air temperature in the workstation. When the ambient air temperature within the workstation rises above a preselected setpoint, the fan may be turned on to increase cooling airflow within the workstation. Once the ambient air temperature falls below the setpoint, the fan may be turned off to conserve power.

Measuring the ambient air temperature, however, has proven to be somewhat problematic. For example, the temperature sensor is typically located on the option module, and thus, is affected by local heating caused by heat transferred directly through the printed circuit board, rather than by the surrounding air. This local heating may cause the temperature sensor to erroneously sense a falsely high ambient temperature, and cause the cooling fan to operate longer than would otherwise be required. Thus, the local heating reduces the effectiveness of the power savings that could otherwise be achieved.

The present invention is directed to overcoming, or at least reducing the effects of, one or more of the problems set forth above.

SUMMARY OF THE INVENTION

In one aspect of the present invention, a method for thermally isolating a temperature sensor mounted on a printed circuit board from a heat generating component mounted on the printed circuit board is provided. The method comprises mounting the heat generating component and the temperature sensor on the printed circuit board, and forming a thermal isolation region in the printed circuit board intermediate the heat generating component and the temperature sensor.

In another aspect of the present invention, an apparatus is provided. The apparatus is comprised of a printed circuit board, a heat generating component, and a temperature sensor. The printed circuit board has a thermal isolation region. The heat generating component is mounted on the printed circuit board adjacent a first side of the thermal isolation region, and the temperature sensor is mounted on the printed circuit board adjacent a second side of the thermal isolation region.

BRIEF DESCRIPTION OF THE DRAWINGS

The invention may be understood by reference to the following description taken in conjunction with the accompanying drawings, in which the leftmost significant digit(s) in the reference numerals denote(s) the first figure in which the respective reference numerals appear, and in which.

Figure 1:
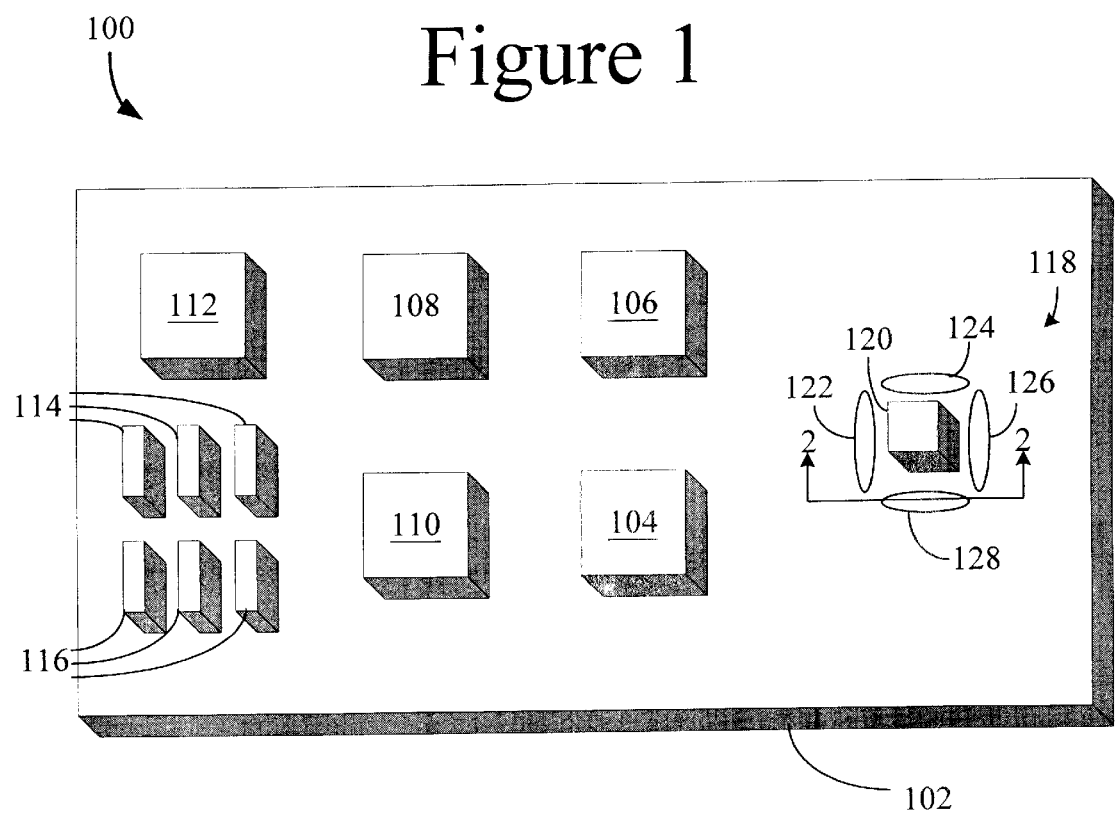
FIG. 1 illustrates a stylized representation of an option module that may be employed in a computer system.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but, on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Illustrative embodiments of a method and apparatus for isolating a temperature sensor from conductive heat transfer is illustrated in FIGS. 1–6. As will be readily apparent to those skilled in the art upon a complete reading of the present application, the present method and apparatus are applicable to a variety of computer systems other than the embodiment illustrated herein, and to electronic devices other than computer systems, including, but not limited to, logic devices, memory devices, and the like.

Turning now to FIG. 1, a stylized representation of an option module 100 that may advantageously employ one or more aspects of the present invention is shown. Generally, the option module 100 is comprised of a printed circuit board 102 with a plurality of components, such as integrated semiconductor devices 104–112 and passive devices 114–116, such as resistors, capacitors, and inductors, as well as an isolated temperature sensing system 118 mounted thereon. The components 104–116 are mounted on the printed circuit board 102 by conventional mechanisms, such as by soldering lead lines or pins extending from the components 104–116 to traces, leads, pads, or the like (not shown) formed on the printed circuit board 102.

Generally, the temperature sensing system 118 is substantially isolated from conductive heat transfer from the components 104–116 through the printed circuit board 102.

The temperature sensing system 118 is comprised of a conventional temperature sensor 120, such as is commercially available from National Semiconductor as part number LM75, Maxim Integrated Devices as part number MAX1617, and Analog Devices as part number AD1021. The temperature sensor 120 may also take the form of an integrated semiconductor device, and thus may be mounted to the printed circuit board 102 using conventional techniques, such as described above. Additionally, the isolated temperature sensing system 118 is further comprised of a series of openings or holes 120–128 disposed about the periphery of the temperature sensor 120 and extending at least partially into the printed circuit board 102.

Figure 2A:
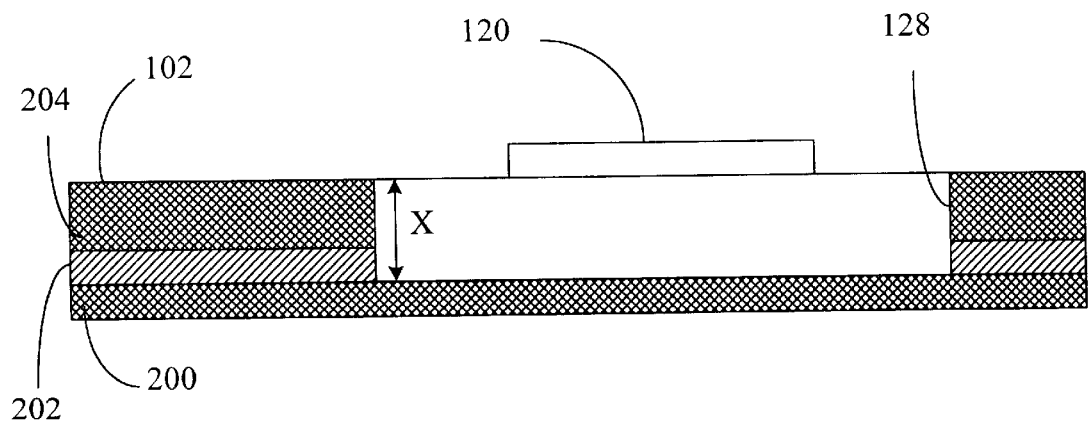
FIGS. 2A and 2B schematically illustrate alternative embodiments of a cross sectional diagram of a portion of the option module of FIG. 1.
Figure 2B:
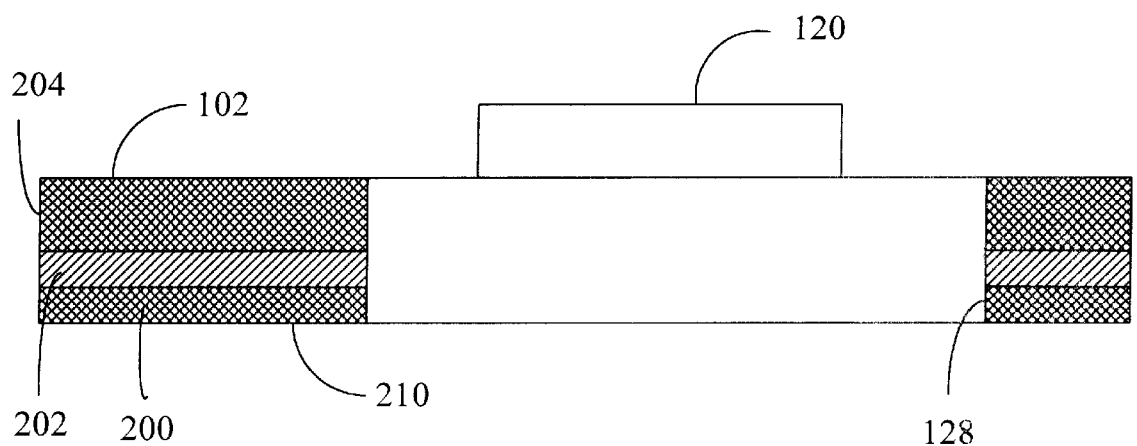

FIG. 2A illustrates a cross sectional side view of a portion of the printed circuit board 102 taken along the line 2—2 extending through the opening 128. The printed circuit board 102 is of a generally conventional construction, including multiple layers, such as a base layer 200, a conductive layer 202, and a top layer 204. The conductive layer 202 may take on a variety of forms, including, for example, a power plane, which is used to distribute electrical power to the various components 104–116 distributed over the surface of the printed circuit board 102. The power plane 202 may be comprised of an electrically conductive material, such as copper, aluminum, or the like. Conductive materials also tend to be good thermal conductors, and thus, the power plane 202 may transmit substantial heat from the components 104–116 throughout the printed circuit board 102.

As discussed above, heat transferred conductively to the temperature sensor 120 may impair its ability to accurately detect the ambient air temperature within the workstation. As shown in FIG. 2A, the openings 122–128, however, extend a preselected distance X into the printed circuit board 102, passing through at least the power plane 202. Owing to the arrangement of the openings 122–128 about the periphery of the temperature sensor 120, the temperature sensor 120 is substantially thermally isolated from the power plane 202, and thus, the components 104–116. The portion of the printed circuit board 102 lying below the openings 122–128 may still conduct heat to the temperature sensor 120, but at a substantially reduced level as compared to the amount of heat transferred by the power plane 202.

The printed circuit board 102 may include a plurality of the conductive layers 202. The depth of the openings 122–128 may extend through a portion or all of the conductive layers 202 to selectively thermally isolate the temperature sensor 220. In an alternative embodiment illustrated in FIG. 2B, the openings 122–128 extend entirely through the printed circuit board 102, opening onto a lower surface 210 of the printed circuit board 102. In this embodiment, even heat transferred through the relatively poor thermal conductor comprising the base layer 200 is substantially blocked.

Figure 3:
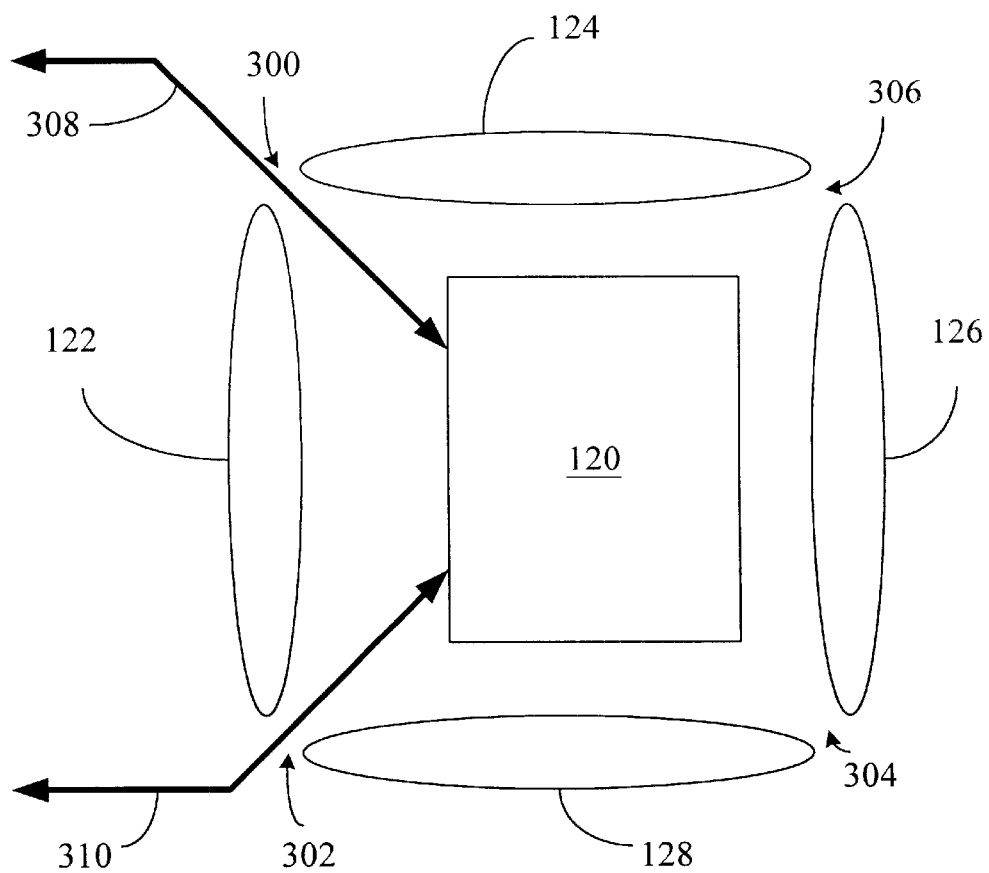
FIG. 3 schematically illustrates an enlarged plan view of a portion of the option module of FIG. 1, including an ambient temperature sensing system.
Figure 4:
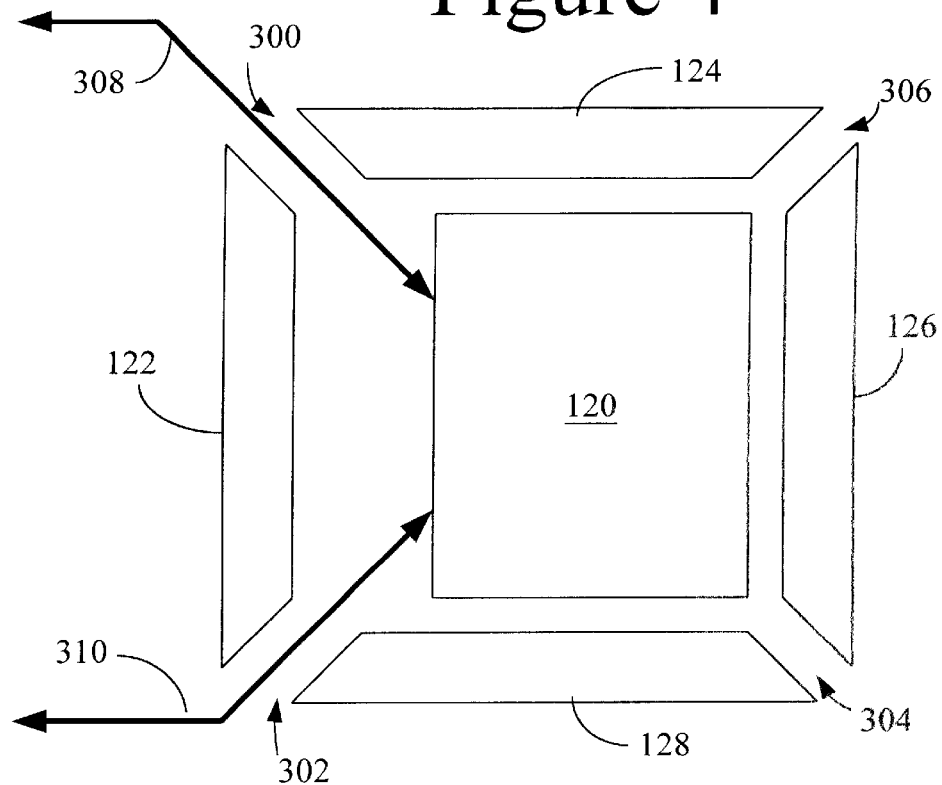
FIG. 4 schematically illustrates an alternative embodiment of the ambient temperature sensing system of FIG. 3.

Turning now to FIG. 3, an enlarged plan view of a portion of the option module 100 of FIG. 1, including the ambient temperature sensing system 118, is shown. The openings 122–128 are positioned about the periphery of the temperature sensor 120, leaving relatively small regions 300–306 undisturbed. That is, within the regions 300–306 the conductive layer 202 passes within the periphery of the openings 122–128 so that the temperature sensor 120 may be coupled thereto. As discussed above, the conductive layer 202 may be comprised of the power plane or may be comprised of a plurality of traces that are coupled to the temperature sensor 120 so that electrical signals may be passed between the temperature sensor 120 and the components 104–116. Moreover, a plurality of the conductive layers 202 may pass through one or more of the regions 300–306. In the embodiment illustrated in FIG. 3, the conductive layer 202 is stylistically represented by the arrows 308, 310 extending through the regions 300, 302 respectively. It should be appreciated that traces or lead lines extending through the regions 300–306 may be coupled to heat generating devices or in the alternative may be coupled to devices that generate little or no heat, such as to connectors that may be selectively coupled to remote devices not necessarily located on the printed circuit board 102.

It should be appreciated that the size of the regions 300–306 may be adjusted against the countervailing design parameters of providing sufficient space to pass power and electrical signals to/from the temperature sensor 120 and thermally isolate the temperature sensor from the components 104–116. In some embodiments, it may be useful to utilize conventional multiplexing or serial signaling techniques to minimize the number of traces and thus, the size of the regions 300–306.

The openings 122–128 may take on any of a variety of sizes and shapes. Moreover, the openings 122–128 may each have different sizes and shapes. For example, in the embodiment illustrated in FIG. 4, the openings 122–128 are generally trapezoidal in configuration. In the instant embodiment, the openings 122–128 are positioned about the periphery of the temperature sensor 120, but spaced slightly apart to again leave the regions 300, 302, 304, 306 through which the conductive layer(s) 202 may pass.

Figure 5:
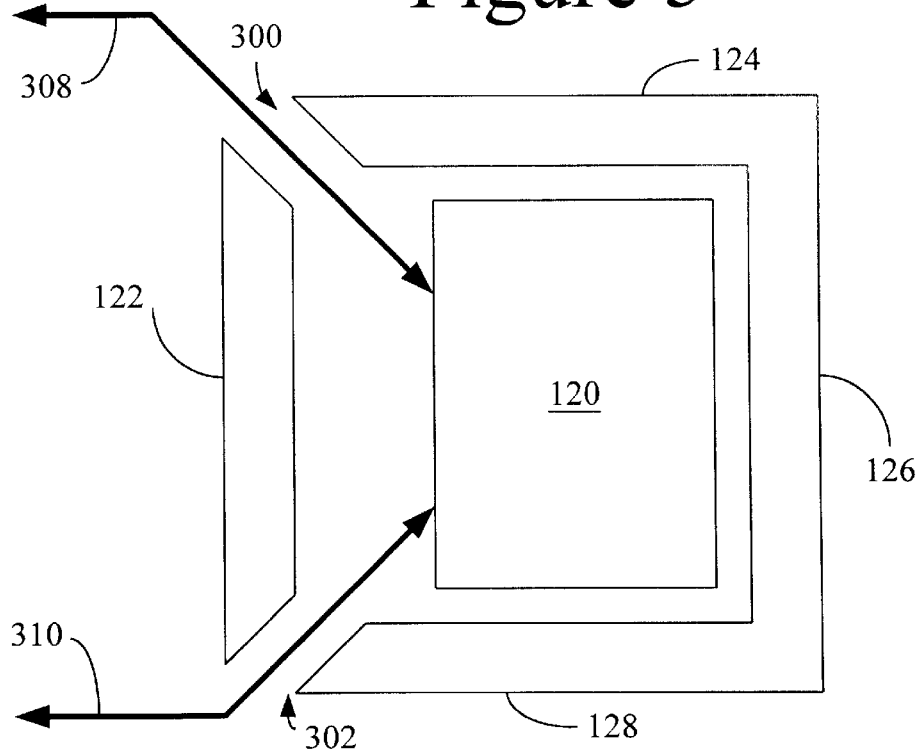
FIG. 5 schematically illustrates an alternative embodiment of the ambient temperature sensing system of FIG. 3.

FIG. 5 illustrates a further embodiment of the instant invention. Where the conductivity between the temperature sensor 120 and the components on the printed circuit board may be adequately supplied without using all of the regions 300–306, then two or more of the openings 122–128 may be joined together to further isolate the temperature sensor 120. For example, in this illustrated embodiment, the openings 124–128 continue about the periphery of the temperature sensor 120 substantially uninterrupted, leaving two regions 300, 302 through which the conductive layer(s) 202 may pass.

Figure 6:
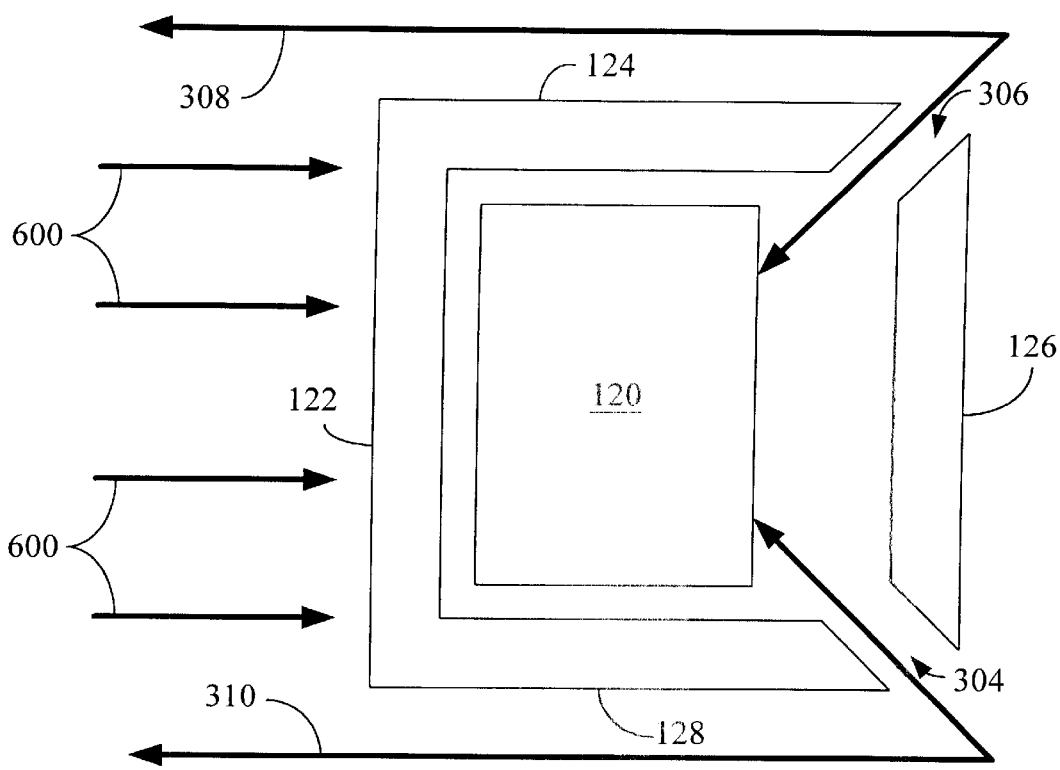
FIG. 6 schematically illustrates an alternative embodiment of the ambient temperature sensing system of FIG. 3.

In an alternative embodiment illustrated in FIG. 6, the openings 122, 124, 128 continue about the periphery of the temperature sensor 120 substantially uninterrupted, leaving the two regions 304, 306 through which the conductive layer(s) 202 may pass. The regions 304, 306 are positioned on a substantially opposite side of the temperature sensor 120 as compared to the heat generating components also located on the printed circuit board 102. Thus, heat flowing from the components is shown represented by the arrows 600, which has a most direct route to the temperature sensor 120 that is interrupted by the openings 122, 124, 128. Thus, the embodiment illustrated in FIG. 6 may have improved thermal isolation characteristics in that the heat flow path from the components to the temperature sensor 120 is circuitous and longer than the heat flow paths available in FIGS. 1–5.

The openings 122–128 shown in the various embodiments of FIGS. 1–6 may be formed using a variety of methods. For example, the openings 122–128 may be formed after the general process of forming the printed circuit board 102, but prior to mounting the components and the temperature sensor 120 thereon. The openings may be formed in the printed circuit board 102 using a variety of mechanical or machining techniques, such as drilling, routing, sawing, and the like. Alternatively, the openings 122–128 may be formed by chemical processing, such as etching. Further, some combination of mechanical and chemical means may be employed to form the openings 122–128.

Alternatively, during the formation of the printed circuit board 102, it may be useful to produce the conductive layer 202 with a pattern such that it does not enter into regions defined by the openings 122–128. Thus, subsequent removal of portions of the printed circuit board to form the openings 122–128 may not involve removal of the conductive layer 202.

However, the temperature sensor 120 remains thermally isolated from the effects of thermal conductivity through the conductive layer 202 in the region of the openings 122–128.

Figure 7:
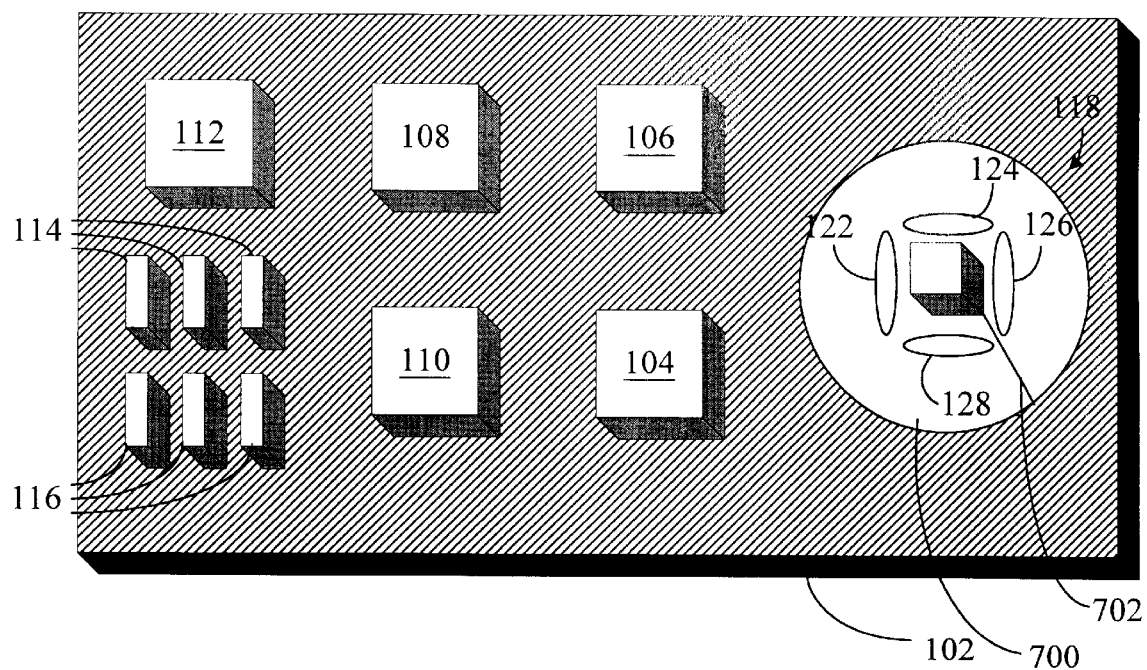
FIG. 7 schematically illustrates an alternative embodiment of a stylized representation of an option module that may be employed in a computer system.

Turning to FIG. 7, an alternative embodiment of the instant invention is shown. In this embodiment, the power plane 202 is also embedded within the printed circuit board 102, but for purposes of illustration is stylistically represented by cross hatching on the surface of the printed circuit board 102. The power plane 202 may selectively extend beneath the surface of the printed circuit board 102 and lie at least partially below he various components 104–112 so that the components 104–112 may be readily supplied with electrical power. In this embodiment, the printed circuit board 102 includes a region 700 that is substantially free from the power plane 202. The absence of the power plane 202 in the region 700 reduces the amount of conductive heat that may be transfe ed from the components 104–116 to the temperature sensor 120 via the power plane 202.

Electric power may still be required by the temperature sensor 120. That power may be provided by a relatively small conductive trace 702 (or group of traces) extending from the power plane 202 to a power input pin (not shown) located on the temperature sensor 120. In the illustrated embodiment, the trace 702 may be routed through one of the regions 300–306 existing between the openings 122–128. It is anticipated that conductive heat will be transferred to the temperature sensor through the trace 702, but at a substantially reduced rate, as compared to the amount of heat that would be transferred by the power plane 202.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for thermally isolating a temperature sensor mounted on a printed circuit board from a heat generating component mounted on the printed circuit board, comprising:

mounting the heat generating component on the printed circuit board;

mounting the temperature sensor on the printed circuit board;

forming a thermal isolation region in the printed circuit board intermediate the heat generating component and the temperature sensor, wherein forming the thermal isolation region in the printed circuit board further comprises forming a plurality of spaced apart openings substantially free of thermally conductive materials.

2. A method, as set forth in claim 1, including electrically coupling the temperature sensor with the heat generating component via electrically conductive material extending between the spaced apart openings.

3. A method, as set forth in claim 1, wherein forming the thermal isolation region in the printed circuit board further comprises forming a region substantially free of thermally conductive materials.

4. A method, as set forth in claim 3, wherein forming the region substantially free of thermally conductive materials further comprises removing electrically conductive materials from the region.

5. A method, as set forth in claim 3, wherein removing thermally conductive materials from the region further comprises machining away a portion of the printed circuit board.

6. A method, as set forth in claim 5, wherein machining away a portion of the printed circuit board further comprises machining away a portion of a power plane located within the printed circuit board.

7. A method, as set forth in claim 3, wherein removing thermally conductive materials from the region further comprises chemically removing a portion of the printed circuit board.

8. A method, as set forth in claim 7, wherein chemically removing the portion of the printed circuit board further comprises etching the portion of the printed circuit board.

9. A method for thermally isolating a temperature sensor mounted on a printed circuit board from a heat generating component mounted on the printed circuit board, comprising:

mounting the heat generating component on the printed circuit board;

mounting the temperature sensor on the printed circuit board;

forming a thermal isolation region in the printed circuit board intermediate the heat generating component and the temperature sensor, wherein forming the thermal isolation region in the printed circuit board further comprises forming a plurality of spaced apart openings about the periphery of the temperature sensor, wherein the spaced apart openings are substantially free of thermally conductive materials.

10. An apparatus, comprising:

a printed circuit board having a thermal isolation region;

a heat generating component mounted on the printed circuit board adjacent a first side of the thermal isolation region; and a temperature sensor mounted on the printed circuit board adjacent a second side of the thermal isolation region, wherein the thermal isolation region further comprises an opening formed in the printed circuit board.

11. An apparatus, as set forth in claim 10, wherein the thermal isolation region in the printed circuit board further comprises a region substantially free of thermally conductive materials.

12. An apparatus, as set forth in claim 10, wherein the thermal isolation region further comprises a region from which electrically conductive materials have been removed.

13. An apparatus, as set forth in claim 10, wherein the thermal isolation region further comprises a region formed free from electrically conductive material.

14. An apparatus, as set forth in claim 10, wherein the printed circuit board includes at least one conductive layer, and the opening formed in the printed circuit board extends below the at least one conductive layer.

15. An apparatus, as set forth in claim 10, wherein the opening is positioned about at least a portion of the temperature sensor.

16. An apparatus comprising:

a printed circuit board having a thermal isolation region;

a heat generating component mounted on the printed circuit board adjacent a first side of the thermal isolation region; and a temperature sensor mounted on the printed circuit board adjacent a second side of the thermal isolation region, wherein the thermal isolation region further comprises a plurality of spaced apart openings formed in the printed circuit board.

17. An apparatus, as set forth in claim 16, wherein the plurality of openings are positioned about at least a portion of the temperature sensor.

18. An apparatus, as set forth in claim 16, wherein the printed circuit board includes at least one conductive layer, and the openings formed in the printed circuit board extend below the at least one conductive layer.

19. An apparatus, as set forth in claim 16, wherein the temperature sensor is electrically coupled with the heat generating component via electrically conductive material extending between the spaced apart openings.

* * * * *